(12) United States Patent
Deen et al.

(10) Patent No.: US 10,026,424 B2
(45) Date of Patent: Jul. 17, 2018

(54) DATA READER WITH SPIN FILTER

(71) Applicant: Seagate Technology, LLC, Cupertino, CA (US)

(72) Inventors: David A. Deen, Edina, MN (US); Taras G. Pokhil, Arden Hills, MN (US)

(73) Assignee: Seagate Technology LLC, Cupertino, CA (US)

( * ) Notice: Subject to any disclaimer, the term of this patent is extended or adjusted under 35 U.S.C. 154(b) by 0 days.

(21) Appl. No.: 15/492,203

(22) Filed: Apr. 20, 2017

(65) Prior Publication Data
US 2017/0287512 A1     Oct. 5, 2017

Related U.S. Application Data

(63) Continuation of application No. 14/869,140, filed on Sep. 29, 2015, now Pat. No. 9,633,678.

(51) Int. Cl.
*G11B 5/39* (2006.01)
*G11C 11/16* (2006.01)
*H01L 43/00* (2006.01)
*H01L 29/66* (2006.01)

(52) U.S. Cl.
CPC ............ *G11B 5/3903* (2013.01); *G11B 5/398* (2013.01); *G11C 11/16* (2013.01); *H01L 43/00* (2013.01); *H01L 29/66984* (2013.01)

(58) Field of Classification Search
None
See application file for complete search history.

(56) References Cited

U.S. PATENT DOCUMENTS

| | | | |
|---|---|---|---|
| 8,405,134 B2 | 3/2013 | Yuasa | |
| 8,619,393 B2 * | 12/2013 | Stokes | G01R 33/093 360/319 |
| 8,717,715 B1 * | 5/2014 | Sato | G11B 5/3906 360/324 |
| 8,760,817 B2 * | 6/2014 | Boone, Jr. | G01R 33/098 360/313 |
| 8,790,797 B2 | 7/2014 | Fukuma et al. | |
| 8,891,207 B1 * | 11/2014 | Li | G11B 5/115 360/121 |

(Continued)

FOREIGN PATENT DOCUMENTS

| | | |
|---|---|---|
| JP | 2005019561 A | 1/2001 |
| JP | 2013020672 A | 1/2013 |

OTHER PUBLICATIONS

S. Takahashi and S. Maekawa, "Spin injection and detection in magnetic nanostructures," Physical Review B 67, 2003, pp. 1-4, 052409, The American Physical Society.

(Continued)

*Primary Examiner* — William J Klimowicz
(74) *Attorney, Agent, or Firm* — Hall Estill Attorneys at Law

(57) ABSTRACT

A data reader may be configured with at least a detector stack positioned on an air bearing surface and consisting of a spin accumulation channel continuously extending from the air bearing surface to an injector stack. The injector stack can have at least one cladding layer contacting the spin accumulation channel. The at least one cladding layer may have a length as measured perpendicular to the ABS that filters minority spins from the detector stack.

19 Claims, 5 Drawing Sheets

(56) References Cited

U.S. PATENT DOCUMENTS

| | | | |
|---|---|---|---|
| 9,042,061 B2 | 5/2015 | Dimitrov et al. | |
| 9,064,509 B2 | 6/2015 | Dimitrov et al. | |
| 9,123,361 B1* | 9/2015 | Kief | G11B 5/265 |
| 9,478,240 B1* | 10/2016 | Deen | G11B 5/3951 |
| 9,633,678 B2* | 4/2017 | Deen | G11B 5/3903 |
| 2001/0053052 A1 | 12/2001 | Ihara et al. | |
| 2006/0262458 A1* | 11/2006 | Carey | G01R 33/093 |
| | | | 360/324.2 |
| 2007/0291422 A1* | 12/2007 | Tsuchiya | B82Y 25/00 |
| | | | 360/324.11 |
| 2009/0052237 A1 | 2/2009 | Morise et al. | |
| 2009/0154030 A1 | 6/2009 | Yamada et al. | |
| 2009/0310263 A1* | 12/2009 | Sasaki | G01R 33/098 |
| | | | 360/319 |
| 2012/0133008 A1* | 5/2012 | Yamada | B82Y 10/00 |
| | | | 257/421 |
| 2013/0044394 A1* | 2/2013 | Stokes | G01R 33/093 |
| | | | 360/319 |
| 2015/0070799 A1* | 3/2015 | Dimitrov | G11B 5/3903 |
| | | | 360/235.4 |
| 2015/0070800 A1* | 3/2015 | Dimitrov | G11B 5/3909 |
| | | | 360/235.4 |

OTHER PUBLICATIONS

L. O'Brien, M. J. Erickson, D. Spivak, H. Ambaye, R. J. Goyette, V. Lauter, P. A. Crowell and C. Leighton, "Kondo physics in non-local metallic spin transport devices," Nature Communications, May 29, 2014, pp. 1-9, Macmillan Publishers Limited.

S. Shirotori, H. Iwasaki, S. Hashimoto, M. Takagishi, Y. Kamiguchi, Iktiar, S. Kasai, Y. K. Takahashi, S. Mitani and K. Hono, "Non-local spin-valves using Heusler alloy with over 10 mV output for HDD reader," Toshiba Corporation, Corporate Research & Development Center & National Institute for Materials Science (NIMS), Nov. 5, 2014, pp. 1-15, MMM CC 01, Toshiba Corporation.

* cited by examiner

DATA READER WITH SPIN FILTER

RELATED APPLICATION

The present application is a continuation of U.S. patent application Ser. No. 14/869,140 filed Sep. 29, 2015, which issues as U.S. Pat. No. 9,633,378 on Apr. 25, 2017.

SUMMARY

Assorted embodiments configure a data reader to have at least a detector stack positioned on an air bearing surface and consisting of a spin accumulation channel continuously extending from the air bearing surface to an injector stack. The injector stack has at least one cladding layer contacting the spin accumulation channel. The at least one cladding layer has a length as measured perpendicular to the ABS that filters minority spins from the detector stack.

DETAILED DESCRIPTION

Figure 1:
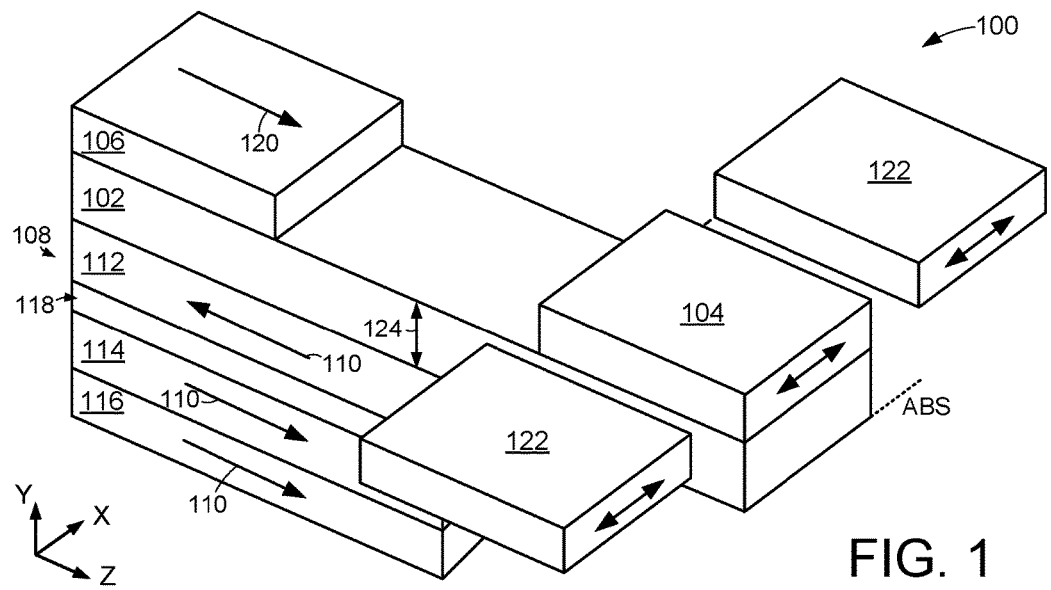
FIG. 1 shows a line representation of a portion of an example data reader arranged in accordance with assorted embodiments.

Meeting consumer and industry demand for larger data capacity and faster data access in reduced form factor data storage devices has corresponded with minimizing the physical size of data storage components while more densely positioning data bits on a data medium. Such reduced component size can stress the fabrication and accuracy of the component. Hence, there is a continued goal of providing smaller data storage components that are stable and provide optimized performance.

The advancement of magnetic reader technology to meet these goals demands reduced scaling of readers that will render conventional data reading, such as perpendicular magnetoresistance-based data readers, inapplicable. The emerging field of spintronics embodies the marriage of magnetic and electronic physics in a solid-state device whereby electron spins may be influenced by both magnetic and electric fields. The conception of spintronic devices for magnetic read heads is therefore esteemed to provide a viable path for next-generation data readers.

Although a lateral spin valve data reader is interesting for advanced magnetic reader embodiments, the detection signals have been less than preferred. Therefore, assorted embodiments leverage the spin-nature of conduction electrons in a lateral spin valve data reader to increase detection signals and optimize performance. A lateral spin valve data reader can provide drastic shield-to-shield spacing (SSS) reduction that allows the reader to be utilized in greater data track density environments. The reduced SSS is further suitable for combination with other data readers in a transducing head.

With a lateral spin valve, a data reader inherently relies on the traversal of a spin-coherent (polarized) current from a magnetic injector lead into an across a non-magnetic channel layer to a detector lead. During the spin-injection process, only a fraction of total injected electron spins maintain their spin coherence. The efficiency by which spin-polarized electrons maintain their initial polarized state after injection into the non-magnetic channel has been termed spin injection efficiency and denoted by the parameter, $\alpha$. Spin injection efficiency is 30% for transparent channels with no tunnel barrier and 30-40% for Ni- and Co-based alloys, which indicates that a majority of spins suffer randomization processes during injection.

During and following the injection of spin-polarized electrons into the non-magnetic channel, the traversal of spin current across the channel medium unavoidably encounters various scattering centers that scatter electron momentum. Some of these momentum scattering processes lead to randomization of the electron spin ensemble, which can be termed de-coherence or spin-flipping. The effect of the randomization of electron spin in the lateral spin valve channel is fewer spin-coherent electrons that make it to the detector contact, which ultimately results in a diminished signal level at the detector lead. Therefore, to maximize the detector signal, a lateral spin valve must minimize the spin scattering centers encountered during their travel to the detector lead as well as maximize the spin-coherent distribution of the electrons in the channel by increasing spin injection efficiency.

FIG. 1 displays a line representation of an example data reader 100 configured to filter out the 'reverse-oriented' minority spin population injected into the channel and maximize the 'forward-oriented' majority spin population in order to maximize the detected signal of the data reader 100. The data reader 100 is a lateral spin valve with a non-magnetic channel 102 continuously extending from an air bearing surface (ABS), where a magnetic detector 104 is positioned, to a magnetic injector 106 that is separated from the ABS. A magnetic spin filter 108 contacts the channel 102, opposite the injector 106. While not limiting, the injector 106, detector 104, and filter 108 can be constructed of similar or dissimilar materials, such as Heusler alloys, dilute magnetic semiconductors, Co, Fe, Ni, and alloys thereof.

Whereas the filter 108 may be constructed of any number of magnetic and non-magnetic layers, various embodiments set fixed magnetizations 110 in first 112 and second 114 ferromagnetic layers with a magnetic pinning layer 116. It is contemplated that the pinning layer is a permanent magnet or antiferromagnetic (AFM) material that maintains the ferromagnetic layers 112 and 114 in predetermined orientations. In the non-limiting example of FIG. 1, the filter 108 is a synthetic antiferromagnet (SAF) where the ferromagnetic layers 112 and 114 are separated by a non-magnetic spacer layer 118 to provide antiferromagnetic coupling that sets the fixed magnetizations 110 at opposite orientations.

By tuning the configuration of the filter 118, the fixed magnetization 110 proximal the channel 102 has an opposite polarity from the injector magnetization 120. When a partially spin-polarized current is injected into the channel 102, the spins that align with the magnetic filter 108 will experience a low energy barrier into the filter lead and are readily absorbed by the filter 108, which leaves behind a higher percentage of electrons with spins aligned in the majority direction of the injector 106.

It is noted that a pair of side shields 122 are positioned on the ABS and separated from the detector 104. The side shields 122 may be magnetic or non-magnetic and increase the data bit resolution of the data reader 100. As shown, the filter 108 is separated from the ABS and the channel 102 has a thickness 124 that is configured to allow efficient transmission of current from the injector 106 to the detector 104. With the filter 108 configured as a SAF, one or more annealing operations can set at least the magnetic orientations 110. That is, a single anneal could serve to set both the injector 106 and ferromagnetic layers 112/114.

Figure 2A:
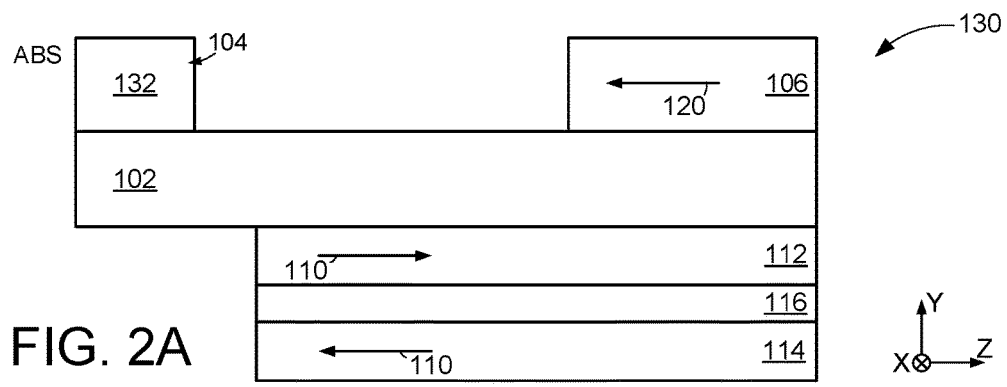
FIGS. 2A and 2B respectively display cross-sectional line representations of portions of an example data reader configured in accordance with some embodiments.
Figure 2B:
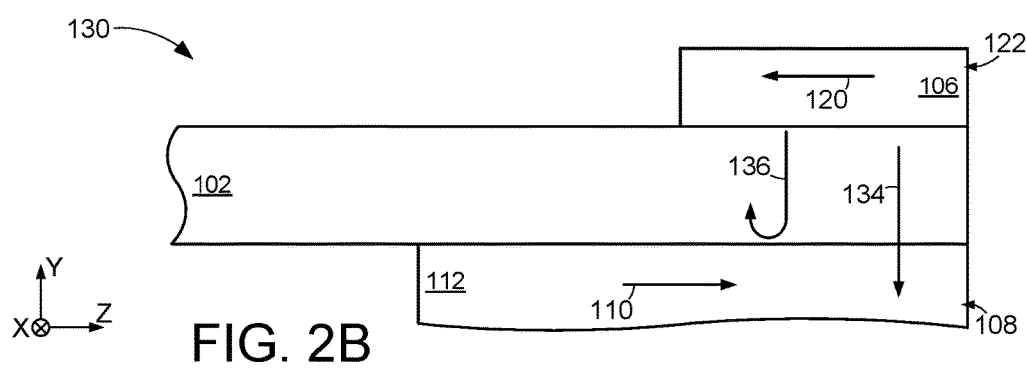

FIGS. 2A and 2B respectively display line representations of portions of an example data reader 130 constructed and operated in accordance with various embodiments. In FIG. 2A, the detector 104 comprises a single magnetically free layer 132 that contacts the channel 102. When a read current is introduced through the injector 106 or directly into the channel 102, minority spins are absorbed by the filter 108, as illustrated by line 134 of FIG. 2B, and majority spins are allowed to propagate down the channel 102 towards the detector 104, as illustrated by line 136.

Increasing the fractional number of majority spins in the channel 102 effectively increases the spin injection efficiency and the detector signal level. The detector signal level is proportional to the magnetoresistance of the detector junction and therefore, approximately the square of the injection efficiency, as given by Equation 1:

$$\Delta R_{NL} = (4\alpha^2 R_{FM}^2)((1-\alpha^2)^2 R_N)^{-1} \left(e^{\wedge}\frac{-d}{\lambda N}\right) \quad \text{(Equation 1)}$$

$$\left(\left[1 + (2R_{FM})((1-\alpha^2)^2(R_N))^{-1}\right]^2 \left(-e^{\wedge}\frac{-2d}{\lambda N}\right)\right)^{-1}$$

where (I↑−I↓)/(I↑+I↓) is a phenomenological parameter describing spin injection efficiency via current polarization, $R_{FM}$ is the spin resistance associated with the ferromagnetic metal, $R_N$ is the spin resistance associated with the non-magnetic channel, d is the physical separation between the injector and detector leads and is the spin diffusion length in the non-magnetic channel. It is noted that Equation 1 pertains to a spin valve operating in a non-local configuration where spin accumulation at the detector 104 is solely responsible for the detector signal. When spin current also includes a drift component (local configuration) the analytical magnetoresistance picture is less clear.

It is noted that the filter 108 is in direct contact with the channel 102. The absence of a tunnel barrier between the channel 102 and filter 108 can promote absorption of minority spins 134. For clarity, the term "majority spin" herein means spin that matches the polarity of the injector magnetization 120 while the term "minority spin" herein means spins that match the filter magnetization 110.

Figure 3:
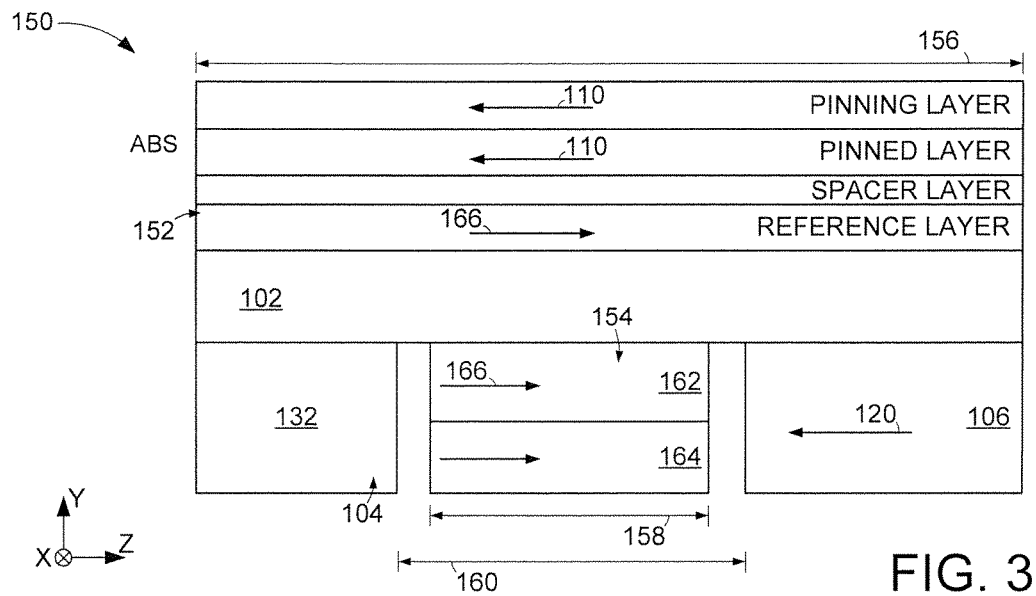
FIG. 3 is a cross-sectional line representation of a portion of an example data reader arranged in accordance with various embodiments.

FIG. 3 is a cross-sectional line representation of a portion of an example data reader 150 arranged in accordance with some embodiments to increase the filtering of minority spins. The channel 102 of the data reader 150 contacts a first filter 152 configured as a SAF and a second filter 154 configured as an exchange coupled lamination. The SAF first filter 152 contacts the ABS and has a length 156 that continuously extends from the detector 104 to the injector 106. Although the filter length 156 can be adjusted, increased filter contact with the channel 102 heightens minority spin absorption.

The second filter 154 is positioned between, and electrically separated from, the detector 104 and injector 106. The second filter 154 has a length 158 that is less than the length 160 of the channel 102. The second filter 154 is constructed of a ferromagnetic layer 162 contacting a pinning layer 164, which may be an AFM or permanent magnet. As shown, the first 152 and second 154 filters have magnetic polarities 166 oriented opposite to the injector magnetization 120 to promote minority spin absorption and the propagation of majority spins to the detector 104. It is contemplated that respective filters 152/154 can have matching configurations, such as materials, position, number of layers, and size, or have dissimilar configurations. Regardless of the configuration of the filters 152/154, the tuned magnetic polarities 166 proximal the channel 102 provide increased injection efficiency and detector signal level.

Figure 4:
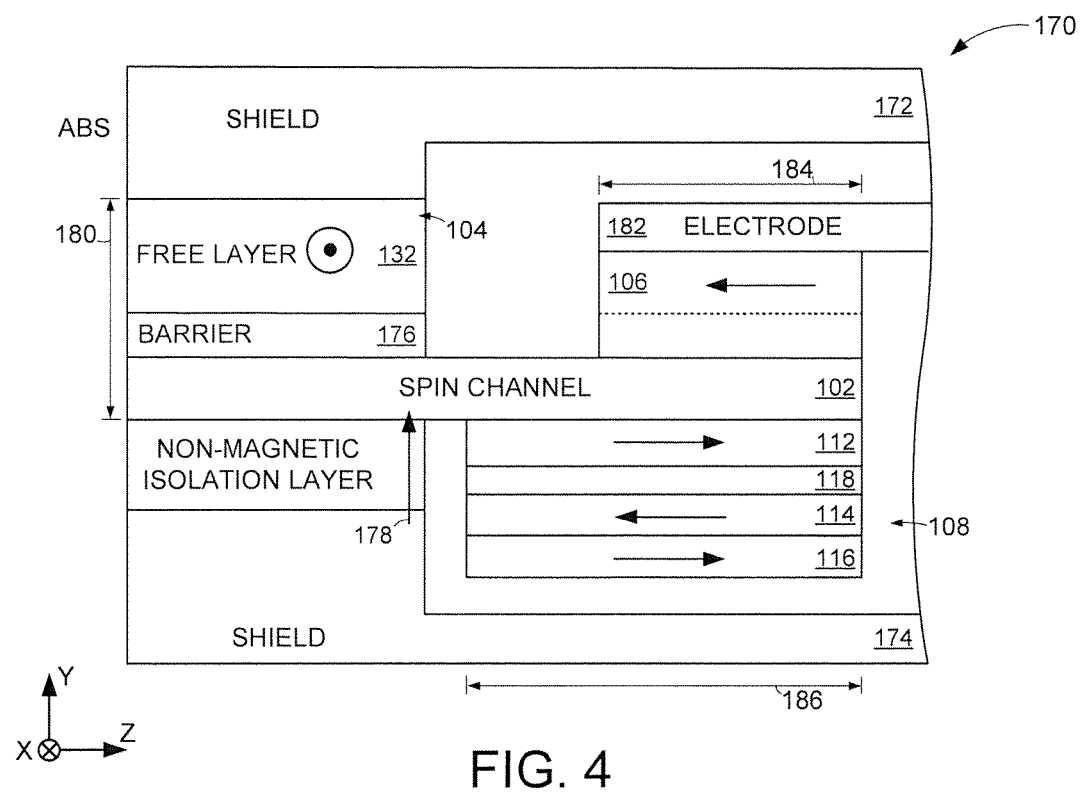
FIG. 4 illustrates a line representation of a portion of an example data reader configured in accordance with assorted embodiments.

FIG. 4 is a cross-sectional line representation of an example data reader 170 configured in accordance with some embodiments to provide optimized data sensing performance with a reduced physical size. The data reader 170 has a detector 104 disposed between top 172 and bottom 174 shields. The detector 104 contacts a barrier layer 176 between the channel 102 and the magnetically free layer 132. Such barrier layer 176 can be tuned for material and size to provide a measureable magnetoresistance when a sensing current 178 passes through the detector 104. The size of the barrier layer 176 may be reduced or eliminated to minimize a shield-to-shield spacing 180 between the shields 172 and 174.

While the SSS 180 can be reduced by moving the injector 106 away from the ABS, the size of the injector 106 may correspond with notches in one, or both shields 172 and 174. It is noted that the respective notches can be filled with insulating material to electrically separate the injector 106 from the detector 104 and shields 172/174. That is, the injector 106 and detector 104 are electrically isolated from one another except through the channel 102.

The injector 106 may have one or more electrodes 182 that act as a terminal to bring a read signal into the channel 102. In accordance with various embodiments, the injector 106 has a length 184 that is less than the length 186 of the filter 108. The filter length 186 can be tuned to provide an optimized balance of minority spin absorption without inhibiting the efficiency of majority spin transmission from the injector 106 to the detector 104.

Figure 5A:
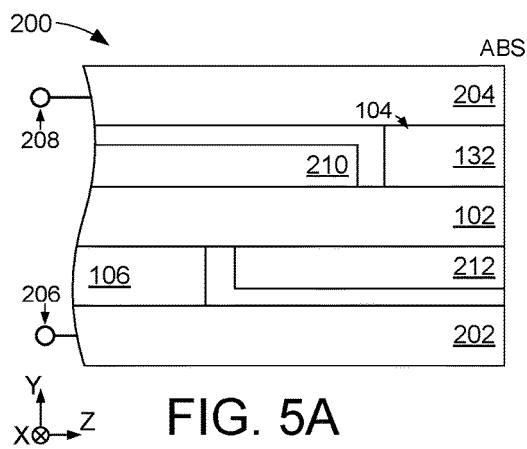
FIGS. 5A-5C respectively show line representations of portions of an example data reader constructed and operated in accordance with some embodiments.
Figure 5B:
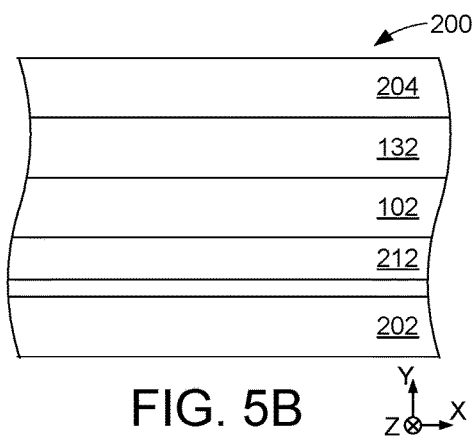
Figure 5C:
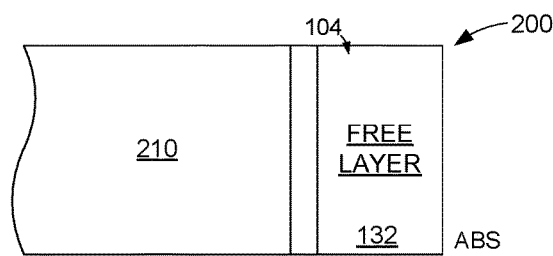

FIGS. 5A, 5B, and 5C respectively convey different line representation views of portions of an example data reader 200 arranged in accordance with assorted embodiments. FIG. 5A is a cross-sectional view of a 2-terminal lateral spin valve with first 202 and second 204 shields serving dual purposes of absorbing stray magnetic fields and passing read current from the injector 106 to the detector 104. As such, the reader 200 has an injector terminal 206 and a detector terminal 208 that maintain the electrical isolation of the injector 106 and detector 104 except through the channel 102.

The channel 102 contacts first 210 and second 212 filter laminations that can each be configured with fixed magnetizations of a predetermined orientation that absorbs minority spins relative to the injector 106 magnetization orientation. The filter laminations 210/212 can be constructed as SAF or exchange coupled structures that are electrically isolated from the injector 106 and detector 104. The respective filter laminations 210/212 can have the same, or different lengths as measured perpendicular to the ABS as well as the same, or different, distances from the respective injector 106 and detector 104.

FIG. 5B displays a top view of the reader 200 from the second shield 204 downward towards the first filter lamination 210 and magnetically free layer 132 of the detector 104. An ABS view of the reader 200 in FIG. 5C illustrates how the second filter 212 extends from the ABS towards the injector 106 while remaining electrically isolated from the first shield 202. The ability to contact the channel 102 with multiple filter laminations 210/212 can optimize data reader 200 performance by increasing the injection efficiency compared to a channel having no filter and scattering centers that degrade injection efficiency and detector signal level.

Figure 6A:
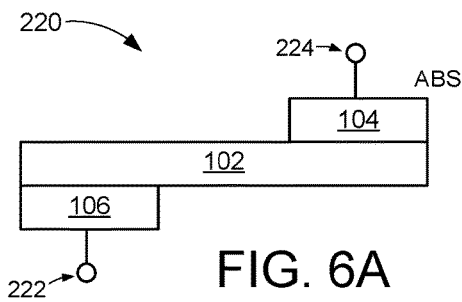
FIGS. 6A-6C respectively display block representations of portions of an example data reader configured in accordance with some embodiments.
Figure 6B:
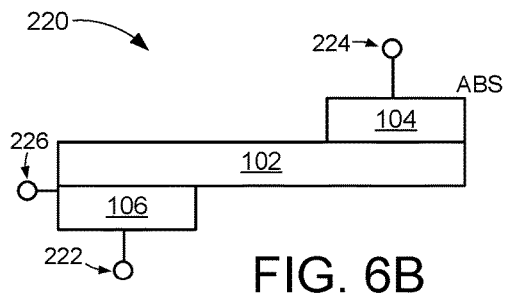
Figure 6C:
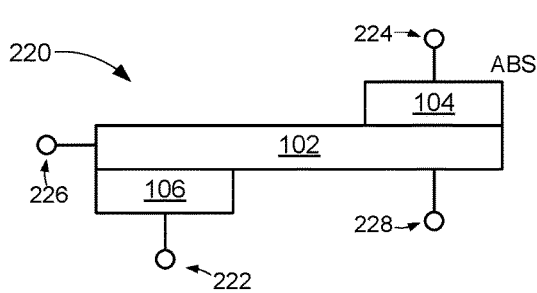

FIGS. 6A-6C respectively display block representations of portions of example lateral spin valve data readers 220 arranged in accordance with various embodiments. In FIG. 6A, the non-magnetic spin channel 102 continuously extends from the ABS to contact the detector 104 and injector 106. The injector 106 is separated from the ABS and allows the size of the reader 220 to be smaller than if the injector 106 was positioned on the ABS. To sense external data bits with the data reader 100, a read signal, such as a current is passed from the injector terminal 222 to a detector terminal 224 through the spin channel 102.

Although the 2-terminal data reader of FIG. 6A can provide accurate data sensing, assorted embodiments add a channel terminal 226, as shown in FIG. 6B. The addition of the channel terminal 226 can allow for different biasing and read signal schemes to tune how the data reader 220 responds to encountered data bits. The capabilities of the data reader 220 may further be complemented by adding a secondary channel terminal 228 proximal the ABS, as shown in FIG. 6C. The 4-terminal configuration of FIG. 6C adds complexity, but allows for terminals 222 and 226 to be utilized as pathway through the channel 102 and injector 106 and for terminals 224 and 228 to be utilized as a pathway through the detector 104 and channel 102.

Figure 7A:
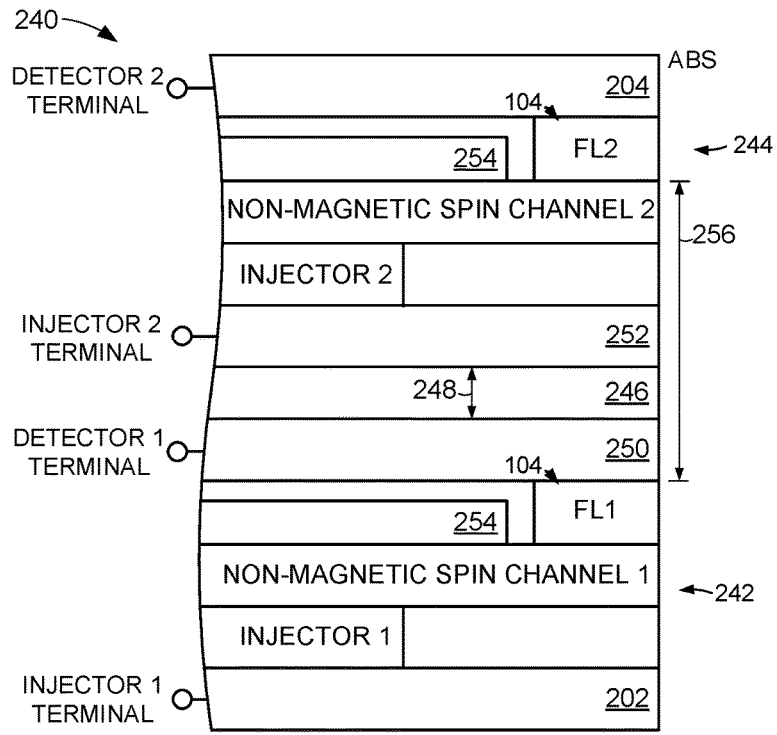
FIGS. 7A and 7B respectively show cross-sectional representations of example data readers.
Figure 7B:
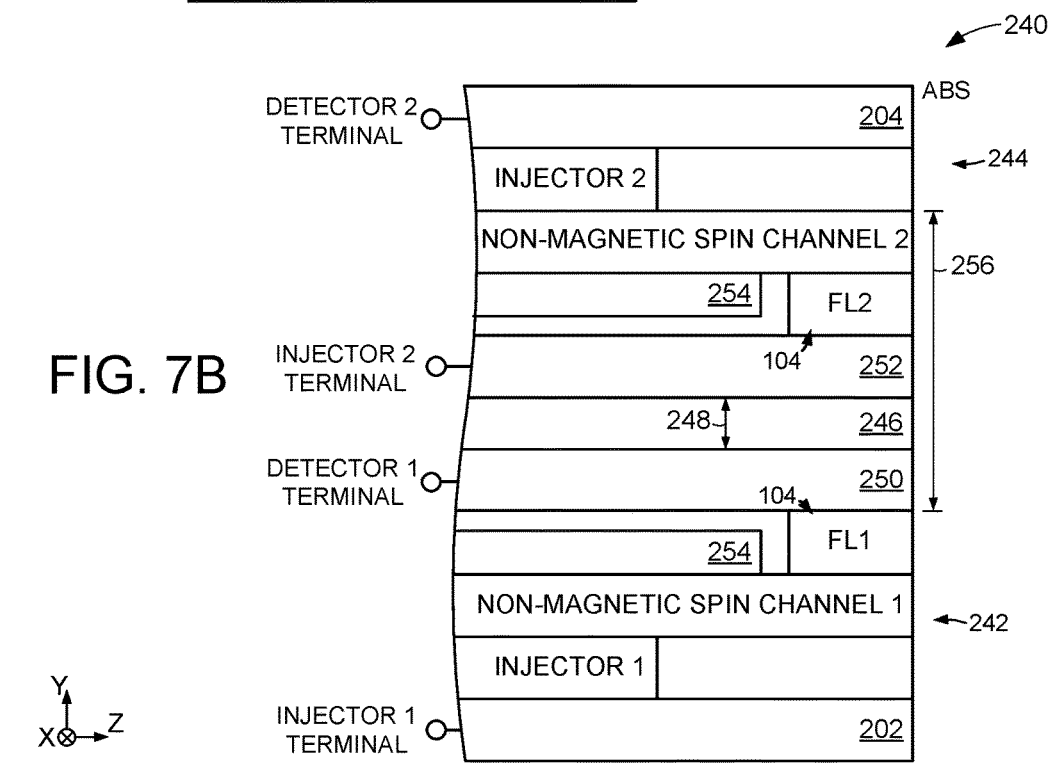

The ability to configure a data reader 220 with multiple terminals can provide a diverse variety of operating capabilities. However, a data reader is not limited to a single detector 104, injector 108, or non-magnetic spin channel 102. FIGS. 7A and 7B respectively display cross-sectional line representations of portions of an example transducing head 240 configured with multiple data readers 242 and 244 in accordance with some embodiments. By positioning the two data readers 242 and 244 together on the ABS, the transducing head 240 can employ successive, redundant, or simultaneous sensing of data bits, such as with two-dimensional data recording (TDMR) environments.

It is noted that while two data readers 242 and 244 are shown, such arrangement is not limiting and any number of readers can be physically connected on the ABS. As shown, the first 242 and second 244 data readers are separated by a non-magnetic insulating layer 246 that can be tuned for thickness 248 to electrically and magnetically isolate the first data reader 242 from the second data reader 244. The insulating layer 246 can be disposed between first 250 and second 252 mid-shields that further isolate the respective data readers 242 and 244.

In some embodiments, each reader 242 and 244 is configured with a spin filter 254 that may be configured with matching, or be dissimilar, materials, numbers of layers, position, and length to increase the spin injection efficiency of the transducing head 240. As a non-limiting example, the spin filter 254 of the first data reader 242 can have a larger length, as measured perpendicular to the ABS, than the spin filter 254 of the second data reader 244. By tuning the configuration of the respective spin filters 254 to be different, the performance of the data readers 242 and 244 will be different, which may be desired in some data storage environments. While the arrangement of the constituent aspects of the respective data readers 242 and 244 can be tuned to match or be different, the orientation of the data readers 242 and 244 may also be tuned.

FIG. 7A illustrates how the data readers 242 and 244 can be configured to provide a spacing distance 256, as measured from the top of the first free layer (FL1) of the first data reader 242 to the bottom of the second free layer (FL2) of the second data reader 244. The spacing distance 256 corresponds with the data bit resolution of the transducing head 240. FIG. 7B illustrates how the same spacing distance 256 can be achieved by flipping the orientation of the second data reader 244 relative to the first data reader 242. The ability to alter the orientation of the respective data readers 242 and 244 can complement the tuned configuration of the spin filters 254 to optimize data sensing performance for the transducing head 240.

Figure 8:
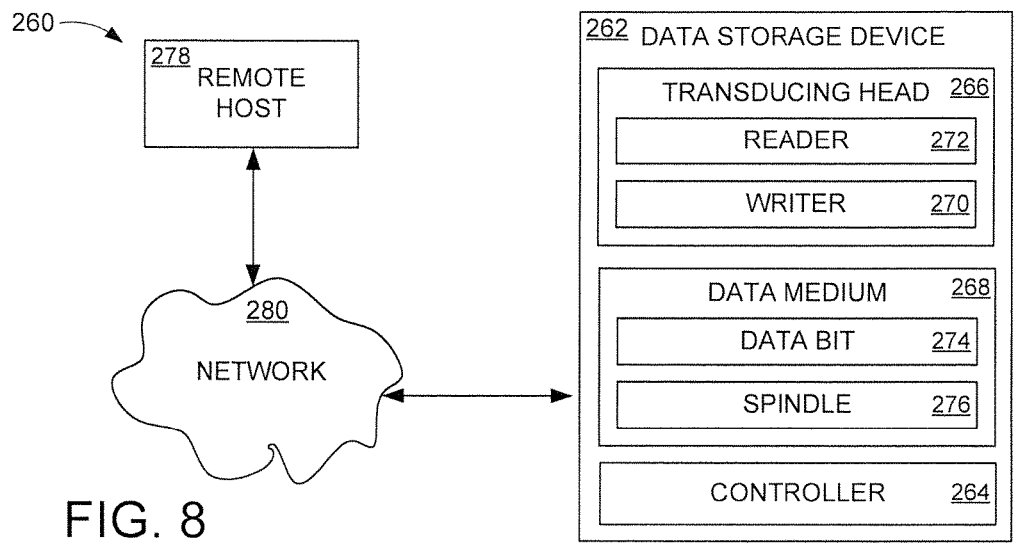
FIG. 8 depicts a line representation of an example data storage system that may employ a data reader in various embodiments.

FIG. 8 depicts a block representation of an example data storage system 260 in which a data reader can be utilized in accordance with some embodiments. The system 260 can employ any number of data storage devices 262 individually and collectively. While not limiting or required, the data storage device 262 of FIG. 8 has a local controller 264 that directs operations between at least one transducing head 266 and one or more data media 268 to store and retrieve data. It is noted that the data storage device 262 can be configured with volatile and/or non-volatile memory structures that rotate or are solid-state, such as in a hybrid hard disk drive with both rotating and solid-state non-volatile memory.

Each transducing head 266 of the data storage device 262 has at least one data writer 270 and data reader 272 that can operate independently and concurrently to program one or more data bits 274 resident in a data medium 268. The local controller 264 facilitates operation of the transducing head 266 by rotating the data medium 268 via a spindle motor 276 to create an air bearing between the data bits 274 and data-accessing writer 270 and reader 272. The local controller 264 can operate alone and in combination with one or more remote hosts 278, such as a processor, server, or node, that is connected to the data storage device 262 via a wired or wireless network 280.

Figure 9:
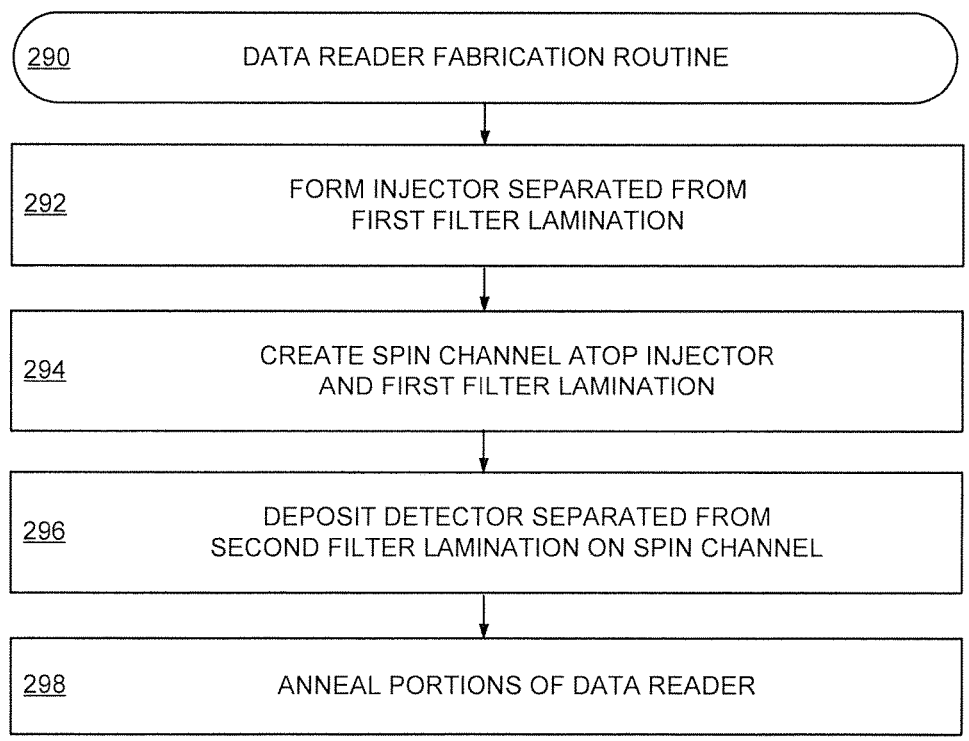
FIG. 9 provides a flowchart of a data reader fabrication routine carried out in accordance with various embodiments.

FIG. 9 provides a flowchart of an example data reader fabrication routine 290 that is carried out in accordance with various embodiments to construct a lateral spin valve data reader that is subsequently utilized to sense data bits in a data storage device of a data storage system. Routine 290 begins by depositing a magnetic injector adjacent to and separated from a first filter lamination in step 292. The first filter lamination may be a SAF or exchange coupled structure that provides a fixed magnetization along. Step 292 may further configure the first filter lamination with a length that may continuously extend to the ABS and/or be greater than the length of the injector.

Next, step 294 creates a non-magnetic spin channel in contact with both the injector and first filter lamination. The spin channel is then used as a substrate for the detector and second filter lamination to be deposited on in step 296. The second filter lamination may be constructed to match, or be dissimilar to, the first filter lamination with regard to the number of layers, materials, and thicknesses to provide an additional fixed magnetization in contact with the spin channel. The material of the various magnetic aspects of the data reader can be selected from alloys of Co, Ni, and Fe as well as from Heusler alloys and dilute magnetic semiconductor materials.

Although not required, the various aspects of the data reader can undergo one or more annealing operations in step 298 that expose the materials to elevated temperatures and a set magnetization orientation. It is contemplated that annealing operations can be conducted on individual components of the data reader, such as the first filter lamination, without exposing all magnetic aspects of the reader to the same annealing conditions.

It is noted that the various steps of routine 290 are not limiting and any portion can be modified or removed just as additional steps and decisions can be incorporated. For example, additional steps can deposit shields in contact with the respective injector and detector or deposit insulating material about the first and second filter laminations to electrically isolate them from the injector and detector. As another example, the first, or second, filter lamination may be omitted from the data reader. The routine 290 may further be configured as a 2, 3, or 4 terminal sensor, as generally illustrated in FIGS. 6A-6C, via one or more fabrication steps.

Through the formation of at least one spin depolarizing structure contacting a magnetic stack portion of a data reader, current contamination of the magnetic stack with spin polarization from adjacent magnetic shields is reduced or eliminated. The ability to tune the material and thickness of the depolarizing layer allows for a range of different depolarizing structures, such as SAF laminations, and materials that are minority spin current carriers tuned for thickness to produce a net zero spin polarization for the magnetic stack. Additionally, the magnetic nature of the depolarizing layer allows the depolarizing structure to be present in a data reader, but not contribute to the shield-to-shield spacing that plays a role in the data bit resolution of a data reader, especially in reduced form factor data storage devices. While various embodiments have been directed to magnetic sensing, the claimed technology can readily be utilized in any number of other applications, including solid state data storage applications.

What is claimed is:

1. An apparatus comprising first and second data readers each extending from a spin accumulation channel continuously extending from an air bearing surface (ABS) and disposed between an injector and detector, the detector of each data reader contacting the spin accumulation channel and the ABS, the injector of each data reader contacting the spin accumulation channel and separated from the ABS and detector, a controller configured to pass a read signal from at least two separate terminals each positioned proximal the injector of the first data reader to at least one terminal positioned proximal the detector of the first data reader to sense data bits on a data storage medium proximal the ABS, a first filter contacts the spin accumulation channel of the first data reader opposite the injector of the first data reader, a second filter contacting the spin accumulation channel of the second data reader opposite the injector of the second data reader, the first and second filters having different lengths as measured perpendicular to the ABS to filter different amounts of minority spins in the first data reader compared to the second data reader.

2. The apparatus of claim 1, wherein a first terminal and a second terminal each separately attach to the injector of the second data reader.

3. The apparatus of claim 2, wherein a third terminal attaches to the detector of the second data reader and a fourth terminal attaches to the spin accumulation channel of the second data reader proximal the ABS.

4. The apparatus of claim 1, wherein a first terminal attaches to the injector of the first data reader and a second terminal attaches to the spin accumulation channel of the first data reader distal the ABS.

5. The apparatus of claim 1, wherein each filter is separated from the detector and ABS.

6. The apparatus of claim 1, wherein each filter filters minority spins from passing to the respective detectors.

7. The apparatus of claim 1, wherein the injector of the first data reader comprises a first material and the detector of the first data reader comprises a second material, the first and second materials each being magnetic.

8. The apparatus of claim 7, wherein the first and second materials are different and selected from the group of: Heusler alloys, dilute magnetic semiconductors, Co, Fe, Ni, Co alloys, Fe alloys, and Co alloys.

9. The apparatus of claim 1, wherein the injector and filter of the first data reader have fixed magnetizations oriented perpendicular to the ABS and the detector of the first data reader has a magnetization oriented parallel to the ABS.

10. The apparatus of claim 1, wherein the first filter has an opposite polarity from the injector of the first data reader.

11. The apparatus of claim 1, wherein each detector is disposed between and separated from first and second side shields on the ABS, each side shield comprising a magnetic material and having a magnetization oriented parallel to the ABS.

12. An apparatus comprising first and second data readers positioned on an air bearing surface (ABS), each data reader comprising a spin accumulation channel continuously extending from the air bearing surface (ABS) and disposed between an injector and detector, the detector of each data reader contacting the spin accumulation channel and the ABS, the injector of each data reader contacting the spin accumulation channel and separated from the ABS and detector, a controller configured to pass a read signal from first and second injector terminals to third and fourth detector terminals to sense data bits on a data storage medium proximal the ABS with the respective data readers, a first filter contacts the spin accumulation channel of the first data reader opposite the injector of the first data reader, a second filter contacting the spin accumulation channel of the second data reader opposite the injector of the second data reader, the first and second filters having different lengths as measured perpendicular to the ABS to filter different amounts of minority spins in the first data reader compared to the second data reader.

13. The apparatus of claim 12, wherein the first terminal attaches to a first shield distal the ABS and the third terminal attaches to a first mid-shield distal the ABS.

14. The apparatus of claim 13, wherein the second terminal attaches to a second mid-shield distal the ABS and the fourth terminal attaches to a second shield distal the ABS.

15. The apparatus of claim 14, wherein a non-magnetic insulating layer is disposed between and contacts the first and second mid-shields.

16. The apparatus of claim 14, wherein the detector of the first data reader contacts the first mid-shield and the detector of the second data reader contacts the second shield.

17. The apparatus of claim 14, wherein the detector of the first data reader contacts the first mid-shield and the detector of the second data reader contacts the second mid-shield.

18. A method comprising:
position first and second data readers proximal a data storage medium, each data reader comprising a spin accumulation channel continuously extending from an air bearing surface (ABS) and disposed between an injector and detector, the detector of each data reader contacting the spin accumulation channel and the ABS, the injector of each data reader contacting the spin accumulation channel and separated from the ABS and detector;
passing a read signal from an injector terminal of the first data reader to a detector terminal of the first data reader as directed by a controller to sense data bits on the data storage medium; and
filtering different amounts of minority spins in the first data reader compared to the second data reader, a first filter contacts the spin accumulation channel of the first data reader opposite the injector of the first data reader, a second filter contacting the spin accumulation channel of the second data readers opposite the injector of the second data reader, the first and second filters having different lengths as measured perpendicular to the ABS.

19. The method of claim 18, wherein each filter filters minority spins from the read signal as the read signal passes through the respective data readers.

\* \* \* \* \*